(12) United States Patent
Kang

(10) Patent No.: US 7,663,935 B2
(45) Date of Patent: Feb. 16, 2010

(54) SEMICONDUCTOR MEMORY DEVICE WITH ADJUSTABLE I/O BANDWIDTH

(75) Inventor: Hee Bok Kang, Daejeon (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/294,531

(22) Filed: Dec. 6, 2005

(65) Prior Publication Data
US 2006/0072361 A1 Apr. 6, 2006

Related U.S. Application Data

(62) Division of application No. 10/629,671, filed on Jul. 30, 2003, now Pat. No. 7,006,387.

(30) Foreign Application Priority Data
Dec. 13, 2002  (KR) ............... 10-2002-0079722

(51) Int. Cl.
*G11C 7/10* (2006.01)
(52) U.S. Cl. ............... 365/189.02; 365/189.03; 365/230.02; 710/307
(58) Field of Classification Search ............... 365/145, 365/189.02 O, 189.03 X, 230.02 X, 230.03, 365/189.02, 189.03, 230.02; 710/307 X, 710/307
See application file for complete search history.

(56) References Cited

U.S. PATENT DOCUMENTS

| 4,447,878 A | * | 5/1984 | Kinnie et al. ............... 710/307 |
| 4,873,664 A | | 10/1989 | Eaton, Jr. |
| 5,134,584 A | | 7/1992 | Boler et al. |
| 5,301,155 A | | 4/1994 | Wada et al. |
| 5,373,467 A | | 12/1994 | Wang |
| 5,404,454 A | | 4/1995 | Parks |
| 5,815,456 A | * | 9/1998 | Rao ............... 365/230.03 |
| 6,067,256 A | * | 5/2000 | Yamashita et al. ...... 365/189.04 |
| 6,078,516 A | | 6/2000 | Hayashi |
| 6,097,666 A | | 8/2000 | Sakui et al. |
| 6,151,242 A | * | 11/2000 | Takashima ............... 365/145 |
| 6,259,628 B1 | | 7/2001 | Park |
| 6,285,611 B1 | | 9/2001 | Kang |
| 6,556,504 B2 | | 4/2003 | Kwon et al. |
| 6,597,621 B2 | | 7/2003 | Tsuji et al. |
| 6,600,674 B2 | | 7/2003 | Kasai |
| 6,775,172 B2 | | 8/2004 | Kang et al. |
| 6,873,536 B2 | * | 3/2005 | Komatsuzaki ............... 365/145 |

FOREIGN PATENT DOCUMENTS

KR  1999-0065972  8/1999

* cited by examiner

*Primary Examiner*—VanThu Nguyen
(74) *Attorney, Agent, or Firm*—Townsend and Townsend and Crew LLP

(57) ABSTRACT

A semiconductor memory device with adjustable I/O bandwidth includes a plurality of data I/O buffers connected one by one to a plurality of I/O ports, a switch array including a plurality of switches for connecting the plurality of data I/O buffers to a plurality of sense amplifier arrays, and a switch control unit for receiving external control signals to control the data I/O buffer and the plurality of switches.

6 Claims, 20 Drawing Sheets

SEMICONDUCTOR MEMORY DEVICE WITH ADJUSTABLE I/O BANDWIDTH

CORRESPONDING RELATED APPLICATION

This application is a divisional of U.S. application Ser. No. 10/629,671 filed Jul. 30, 2003, which claims priority to Korean Patent Application No. 2002-79722 filed Dec. 13, 2002, both of which are hereby incorporated by reference in their entirety.

BACKGROUND OF THE INVENTION

1. Field of the Invention

The present invention generally relates to a semiconductor memory device, and more specifically, to a semiconductor memory device compatible with various systems having different kinds of data input/output (I/O) bandwidths.

2. Description of the Prior Art

A conventional memory device has a fixed I/O bandwidth. A system using a memory device may have different bandwidths depending on manufacturing companies or its usage. Therefore, the conventional memory device requires an additional interfacing device to be used in a system having different data bandwidth from that of the conventional memory device.

SUMMARY OF THE INVENTION

It is therefore an object of the present invention to provide a memory device configured to control a bandwidth of I/O data.

According to an embodiment of the present invention there is provided a memory device, including: a plurality of data I/O buffers connected one by one to a plurality of I/O ports; a switch array including a plurality of switches for connecting the plurality of data I/O buffers to a plurality of sense amplifier arrays; and a switch controller for receiving an external control signal to control the data I/O buffers and the plurality of switches.

DETAILED DESCRIPTION OF THE PREFERRED EMBODIMENTS

The present invention will be described in more detail with reference to the accompanying drawings.

Figure 1:
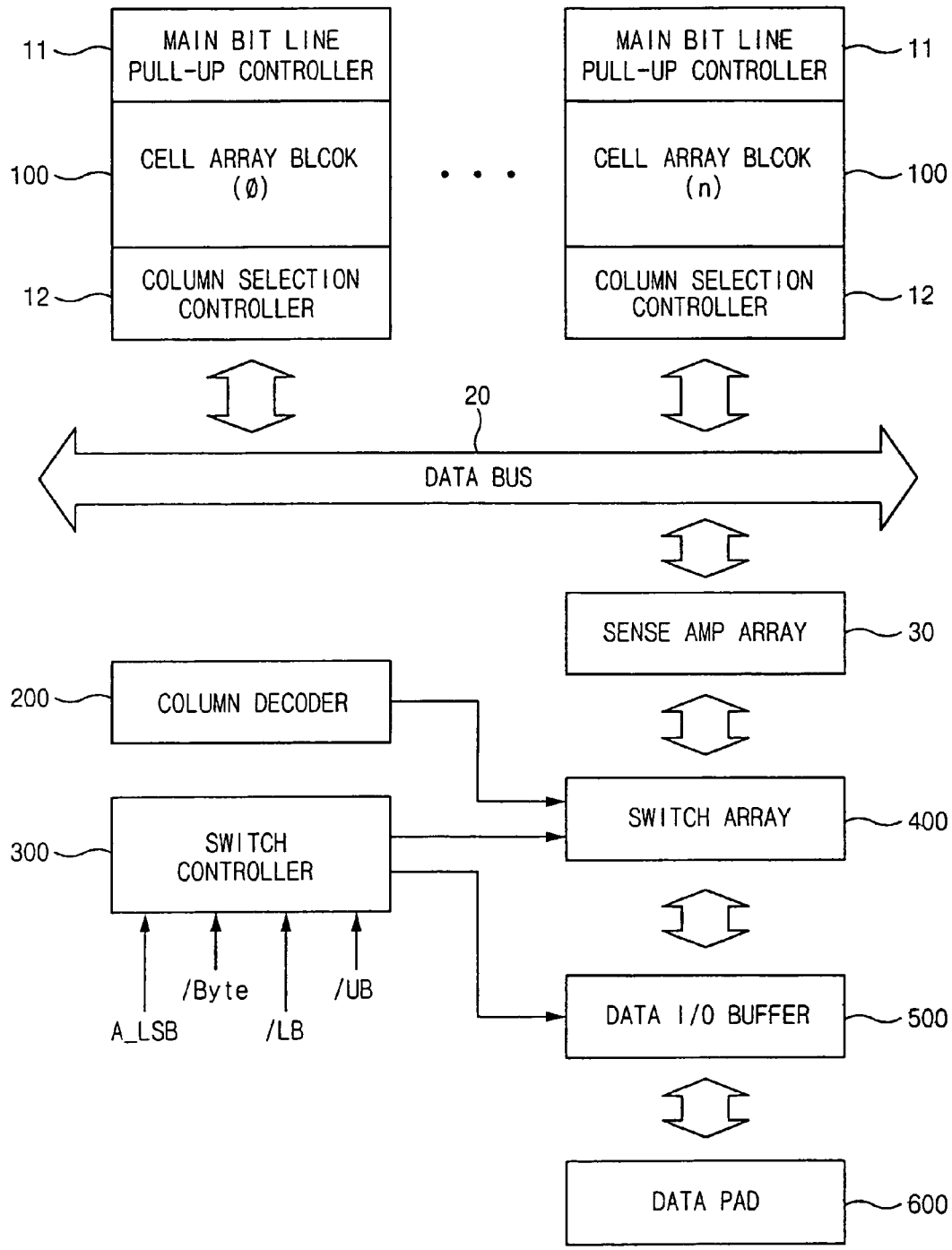
FIG. 1 is a block diagram illustrating a structure of a memory device according to a preferred embodiment of the present invention.

FIG. 1 is a block diagram illustrating a structure of a memory device which can control an I/O bandwidth according to a preferred embodiment of the present invention. The memory device of the present invention comprises a cell array block 100, a main bitline pull-up controller 11 for pulling up a main bitline included in the cell array block 100 to a positive voltage, a column selection controller 12 for connecting the main bitline to a data bus 20, a sense amplifier array 30 connected to the data bus 20, a switch array 400 for controlling the sense amplifier array, and a data I/O buffer 500 for exchanging data with the sense amplifier array 30. Additionally, the memory device of the present invention comprises a column decoder 200 for controlling the switch array 400, and a switch controller 300 for controlling the switch array 400 and the data I/O buffer 500. The memory device further comprises I/O ports or data pads 600 connected to the data I/O buffer 500 for inputting and outputting a plurality of data bits (data signals are referred to herein as "data bits").

Figure 2:
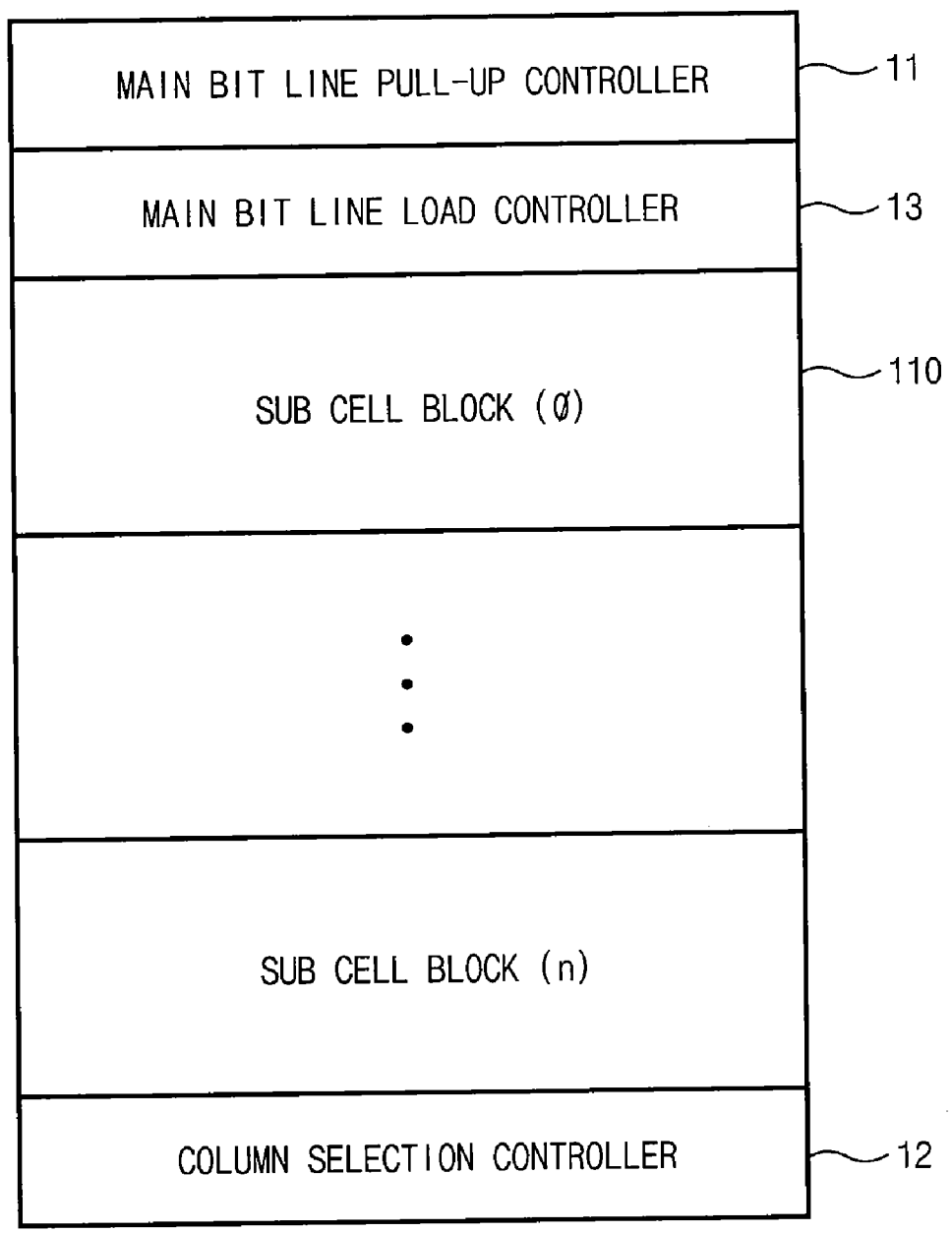
FIG. 2 is a structural diagram illustrating a main bitline pull-up controller, a cell array block, and a column selection controller of FIG. 1.

FIG. 2 is a structural diagram illustrating a cell array block 100 of FIG. 1. The cell array block 100 comprises one or a plurality of main bitline load controllers 13 and a plurality of sub cell blocks 110.

Figure 3:
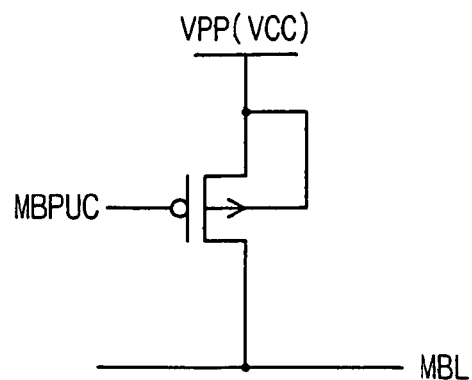
FIG. 3 is a structural diagram illustrating the main bitline pull-up controller of FIG. 2.

FIG. 3 is a structural diagram illustrating the main bitline pull-up controller 11 of FIG. 2. The main bitline pull-up controller 11 comprises a PMOS transistor having a gate to receive a control signal MBPUC, a source connected to a power source VPP(VCC) and a drain connected to a main bitline MBL.

The main bitline pull-up controller 11 pulls up the main bitline MBL to a voltage VPP(VCC) in a precharge operation.

Figure 4:
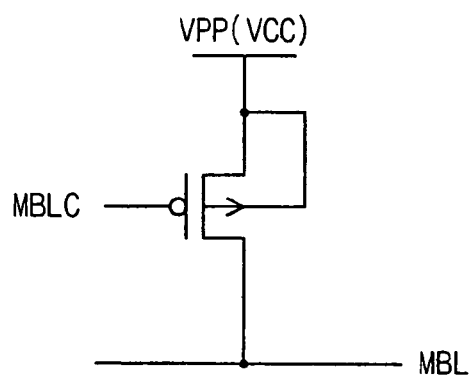
FIG. 4 is a structural diagram illustrating a main bitline load controller of FIG. 2.

FIG. 4 is a structural diagram illustrating the main bitline load controller 13 of FIG. 2. The main bitline load controller 13 comprises a PMOS transistor having a gate to receive a control signal MBLC, a source connected to a power source VPP(VCC) and a drain connected to the main bitline MBL.

The main bitline load controller 13, as a resistant device connected between the power source VPP(VCC) and the main bitline MBL, determines a potential of the main bitline according to the amount of current flowing through the main bitline load controller 13 in data sensing action.

One or more of the main bitline load controllers 13 are connected to one main bitline MBL. When two or more main bitline load controllers 13 are connected to one main bitline, the same number of sub cell blocks 110 are assigned to a main bitline load controller 13 and the main bitline load controllers 13 are evenly placed apart from each other.

Figure 5:
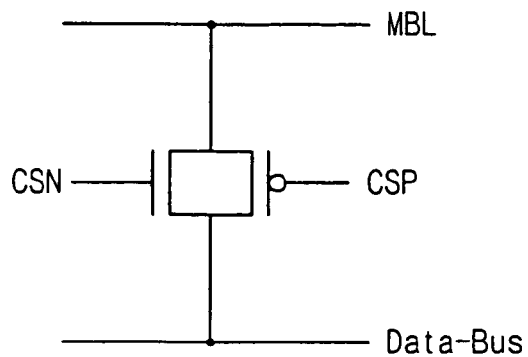
FIG. 5 is a structural diagram illustrating a column selection controller of FIG. 2.

FIG. 5 is a structural diagram illustrating the column selection controller 12 of FIG. 2. The column selection controller 12 is a switch for connecting the main bitline MBL to a data bus. On/off operations of the column selection controller 12 are controlled by control signals CSN and CSP.

Figure 6:
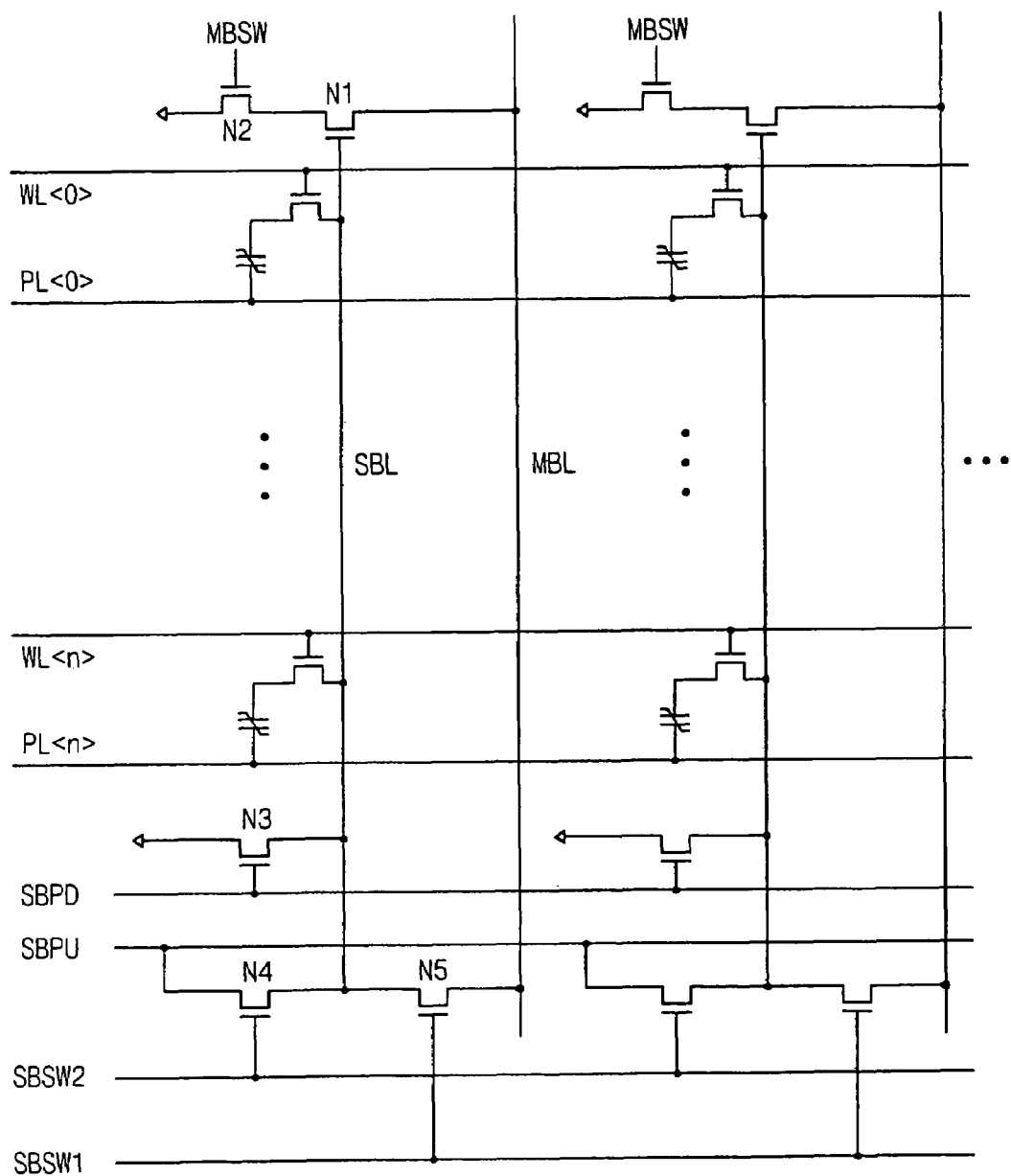
FIG. 6 is a detailed structural diagram illustrating a sub cell block of FIG. 2.

FIG. 6 is a detailed structural diagram illustrating the sub cell block 110 of FIG. 2.

The sub cell block 110 comprises a sub bitline SBL, and NMOS transistors N1, N2, N3, N4 and N5. The sub bitline SBL is connected in common to a plurality of unit cells, each of which is connected to a wordline WL<m> and a plateline PL<m>. The NMOS transistor N1 for regulating a current has a gate connected to a first terminal of the sub bitline SBL, and a drain connected to the main bitline MBL. The NMOS transistor N2 has a gate connected to a control signal MBSW, a drain connected to a source of the NMOS transistor N1 and a source connected to a ground. The NMOS transistor N3 has a gate connected to a control signal SBPD, a drain connected to a second terminal of the sub bitline SBL and a source connected to a ground. The NMOS transistor N4 has a gate connected to a control signal SBSW2, a source connected to the second terminal of the sub bitline SBL and a drain connected to a control signal SBPU. The NMOS transistor N5 has a gate connected to a control signal SBSW1, a drain connected to the main bitline MBL and a source connected to the second terminal of the sub bitline SBL.

When a unit cell is to be accessed, only the sub bitline connecting the unit cell is connected to the main bitline. Here, the sub bitline SBL is connected to the main bitline MBL by the NMOS transistor N5. Accordingly, memory read/write operations can be performed even with a smaller amount of load corresponding to one sub bitline rather than a larger amount of load corresponding to the whole bitline.

A potential of the sub bitline SBL is grounded when the control signal SBPD is activated. The control signal SBPU regulates a voltage to be provided to the sub bitline SBL. The control signal SBSW1 regulates the flow of a signal between the sub bitline SBL and the main bitline MBL. The control signal SBSW2 regulates the flow of a signal between the control signal SBPU and the sub bitline SBL.

The sub bitline SBL connected to a gate of the NMOS transistor N1 regulates a sensing voltage of the main bitline. The main bitline MBL is connected to the power source VPP(VCC) via the main bitline load controller 13 (see FIG. 4). When a control signal MBSW becomes "high", current flows from the power source VPP(VCC), through the main bitline load controller 13, the main bitline MBL and the NMOS transistors N1 and N2, to a ground. Here, the amount of the current is determined by a voltage of the sub bitline SBL connected to the gate of the NMOS transistor N1. If data of a cell is "1", the amount of the current becomes larger, thereby decreasing the voltage of the main bitline MBL. If data of a cell is "0", the amount of the current becomes smaller, thereby increasing the voltage of the main bitline MBL. Here, the cell data can be detected by comparing the voltage of the main bitline MBL with a reference voltage. Detecting the cell data is performed in the sense amplifier array 30.

Figure 7A:
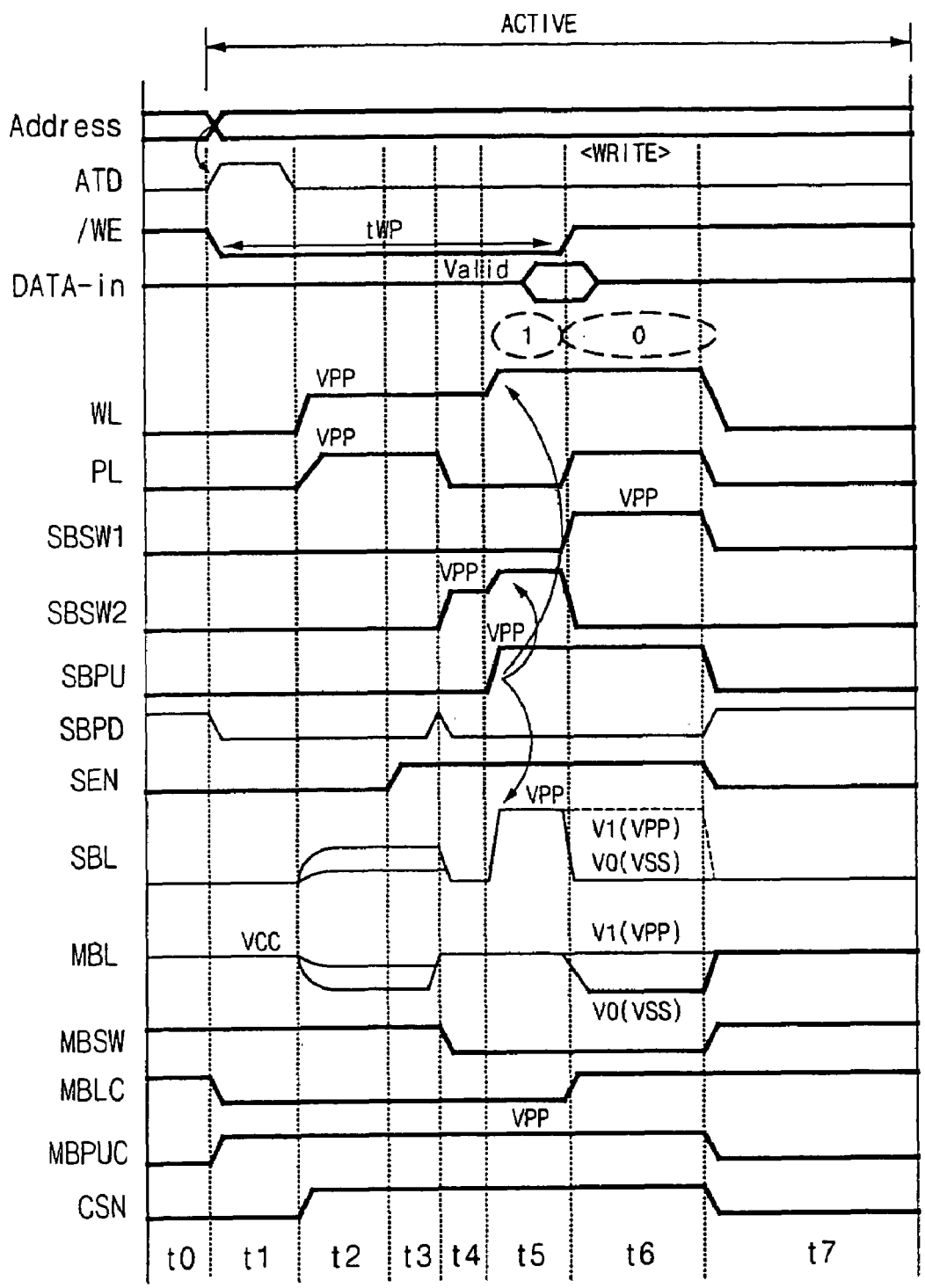
FIGS. 7a and 7b are timing diagrams illustrating read/write operations of the sub cell block of FIG. 6.

FIG. 7a is a timing diagram illustrating a write operation of the sub cell block of FIG. 6.

If an address transits in t1, a chip starts a writing operation according to an address transition detection signal ATD.

In t2 and t3, data of a cell is detected by activating a wordline WL and a plateline PL. When data of the cell is "high", the voltage of the sub bitline rises, and current flowing through the NMOS transistor N1 becomes larger. As a result, the voltage of the main bitline MBL becomes lower than a reference level. On the other hand, if data of the cell is "low", the voltage of the sub bitline SBL falls, and current flowing through the NMOS transistor N1 becomes smaller. As a result, the voltage of the main bitline MBL becomes higher than a reference level.

In t4, a self-boosting operation is prepared by setting the control signal SBSW2 at a "high" level. In t5, "high" level data is written into the cell. If the control signal SBSW2 is "high", the control signal SBSW2, the wordline WL and the sub bitline SBL are driven to "high" levels when the control signal SBPU becomes "high". Voltages of these signals rise higher than the voltage VPP by the self-boosting operation. In t5, since the wordline WL and the bitline SBL are high, and the plateline PL is low, data "1" is automatically written into the cell.

In t6, "low" level data is written. If the control signals SBPD and SBSW2 are inactivated, and the control signal SBSW1 is activated, data "0" provided from the main bitline MBL is supplied to the sub bitline SBL. Here, since the voltage of the plateline PL is "high", data "0" is written into the cell. If a signal provided from the bitline is "1", the voltage of the plateline is "high", and the voltage of the sub bitline SBL is also "high". As a result, data "1" written in t5 is maintained without change.

In order to improve a sensing margin by stabilizing an initial state of a cell storage node, the wordline WL is activated earlier than the plateline. Then, the wordline WL is activated in t2, and then the plateline PL in t3. In t2, the control signal SBPD is maintained at the "high" level, the data of the cell is initialized as "0". After initialization, the control signal SBPD is inactivated to the "low" state, and the plateline is activated to the "high" level. After the data "0" is written in t6, the wordline WL is inactivated earlier than the plateline PL by inactivating the wordline WL in t7, and then the plateline PL in t8 (not shown).

Figure 7B:
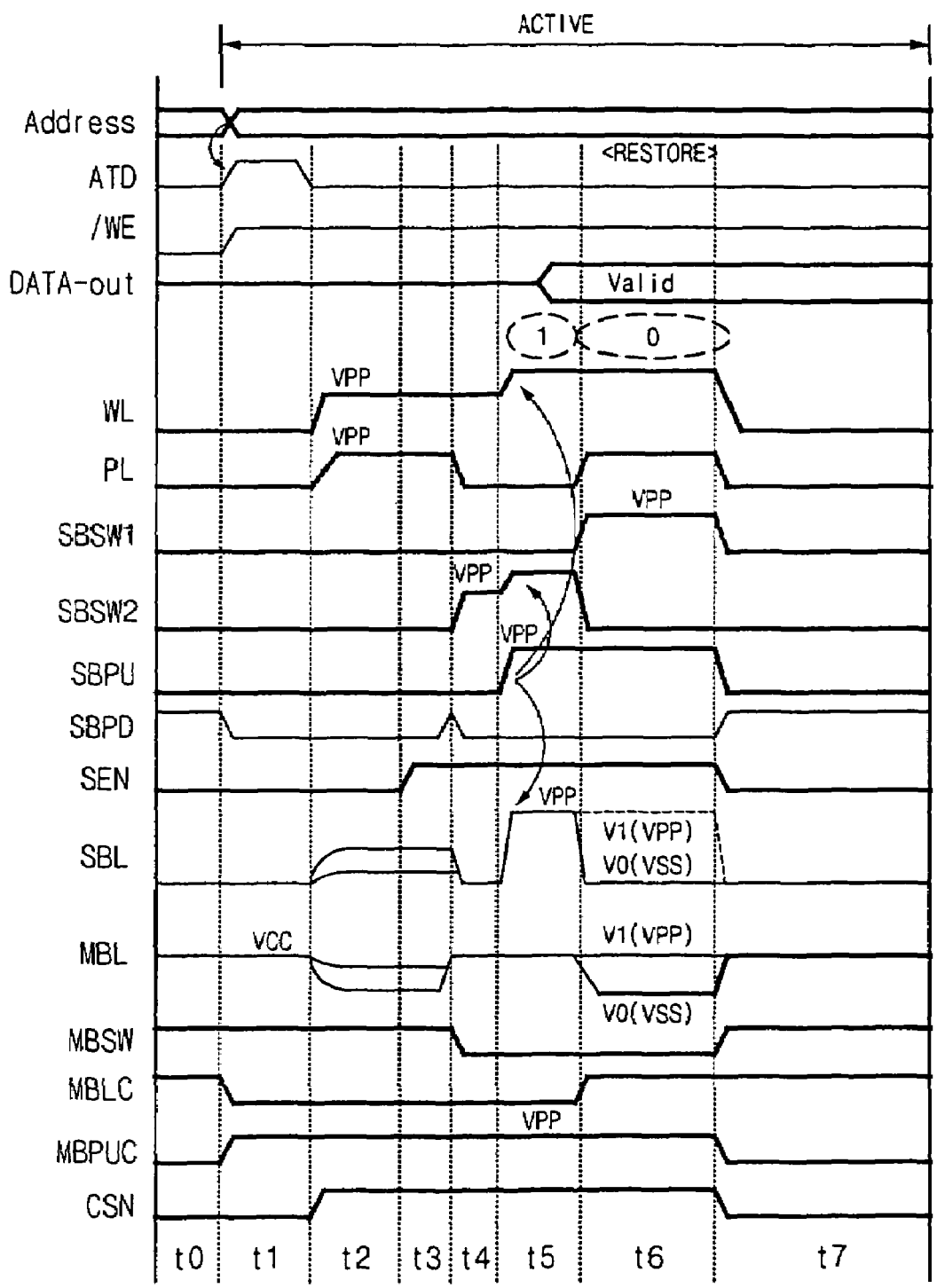

FIG. 7b is a timing diagram illustrating a read operation of the sub cell block of FIG. 6.

The operations in the intervals t2 through t6 are as described in FIG. 7a. The read operation is different in that data detected in a sense amplifier (not shown) is not externally outputted.

In t5 and t6, a restore operation is performed. In the restore operation, the data detected in the sense amplifier (not shown) is temporarily stored, and then rewritten into the cell. Since the data stored in the sense amplifier is provided to the cell through the bitline, the restore operation is similar to the write operation. In t5, the data "1" is automatically written in the same manner of the write operation. In t6, the data "1" written in the section t5 is maintained if the data "1" is provided to the bitline, and the data "0" is written if the data "0" is provided to the bitline.

FIGS. 8a through 8d are structural diagrams illustrating a data I/O buffer and a data pad of FIG. 1.

Figure 8A:
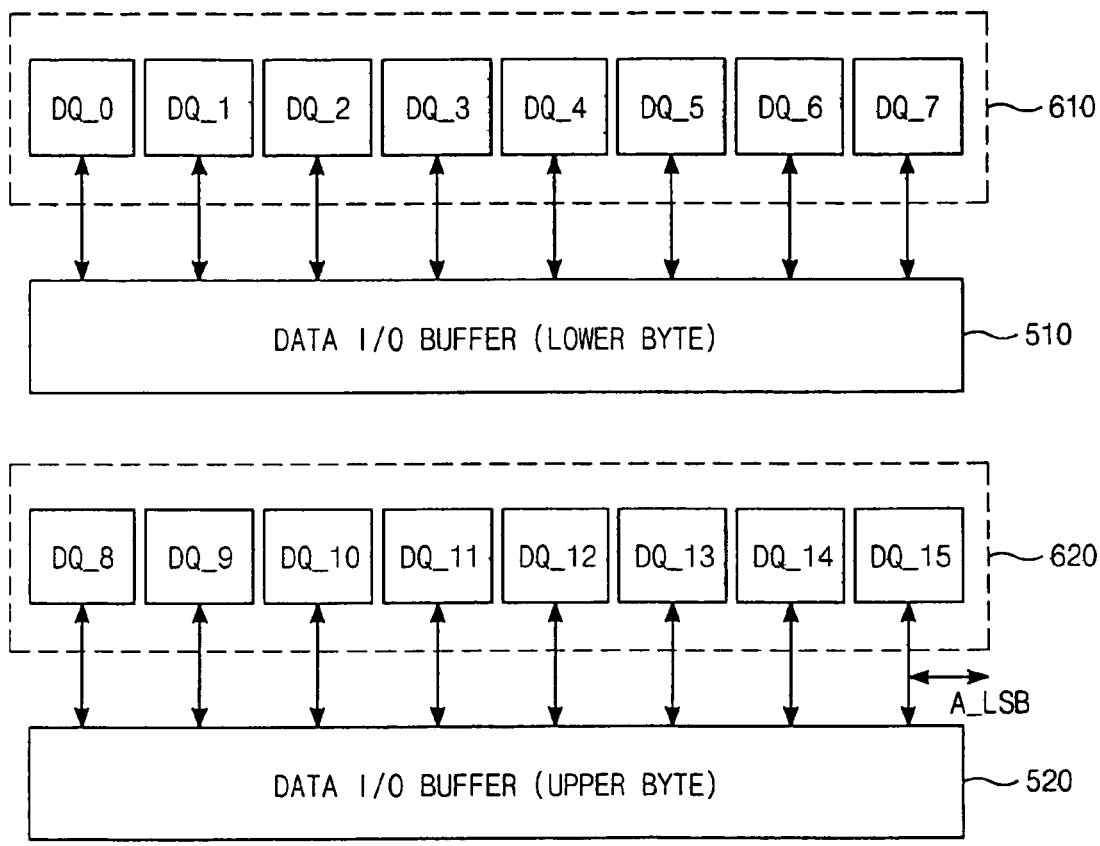
FIGS. 8a through 8d are structural diagrams illustrating a data I/O buffer and a data pad of FIG. 1.

Referring to FIG. 8a, data pads 610 and 620 comprise DQ_0 through DQ_15. The data pads 610 and 620 are connected to a data I/O buffer 500 (see FIG. 1). The data I/O buffer 500 is divided into a lower byte region 510 and an upper byte region 520. DQ_0 through DQ_7 are connected to the lower byte region 510, and DQ8 through DQ15 are connected to the upper byte region 520. DQ_15 in the upper byte is used as an A_LSB signal which is provided to the switch controller 300 (see FIG. 1). The A_LSB signal corresponds to an additional address signal. For example, when a system bus processes data by 1 byte, and a memory device processes data by 2 bytes, data of 2 bytes should be stored in a memory address for efficiency of the memory device. However, since the system processes data in 1 byte, 2 bytes should be differentiated and then processed by the memory device. Here, by using the control signal A_LSB, data inputted/outputted to and from the memory device can be processed by 1 byte.

Figure 8B:
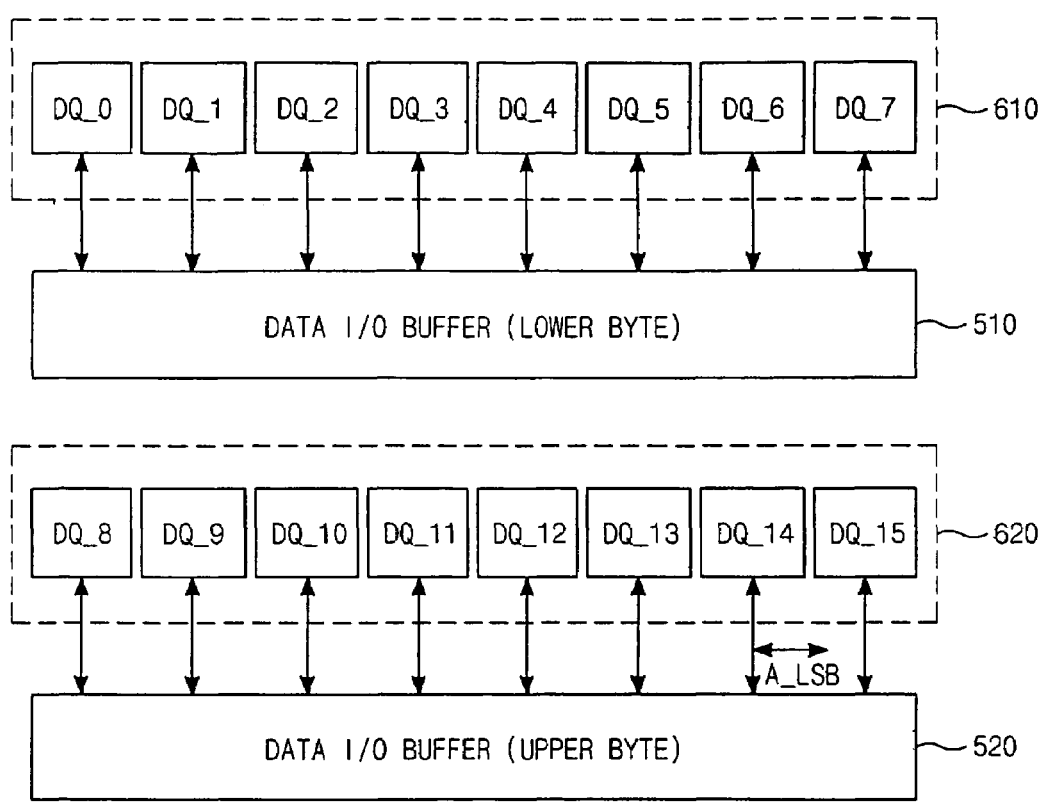

FIG. 8b has the same structure as FIG. 8a. However, it is different in that the A_LSB signal is provided from one of the bits DQ_8 through DQ_14 included the upper byte except the most significant bit DQ_15.

Figure 8C:
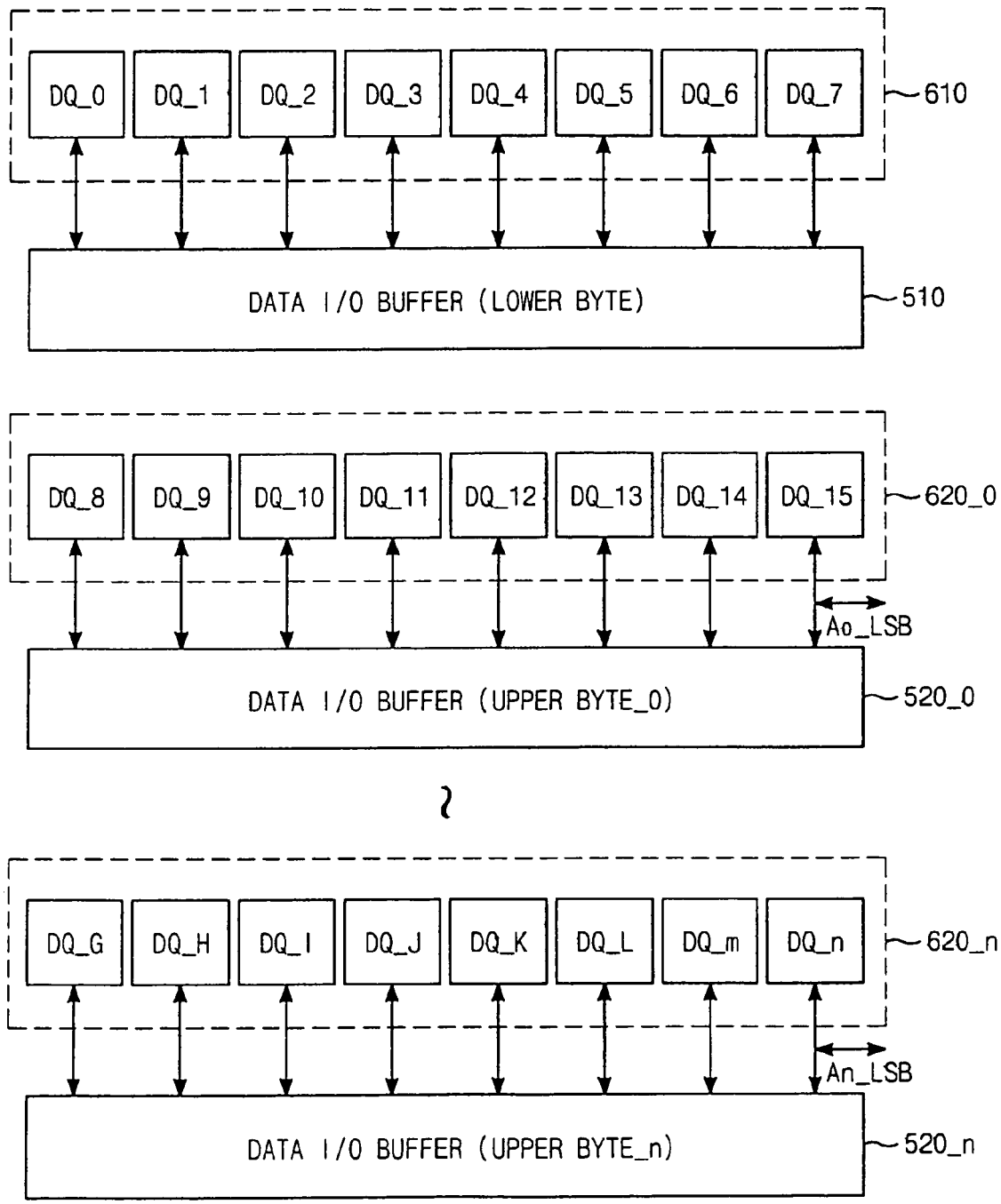

A preferred embodiment shown in FIG. 8c comprises a plurality of upper byte regions unlike the preferred embodiments shown in FIGS. 8a and 8b. A control signal which is one of $A_0\_LSB, \ldots, A_n\_LSB$, exists in each of the upper byte regions. These signals are outputted from the most significant bit in each upper byte region. The control signals $A_0\_LSB$ through $A_n\_LSB$ are used as additional address signals like the control signal A_LSB of FIG. 8a.

Figure 8D:
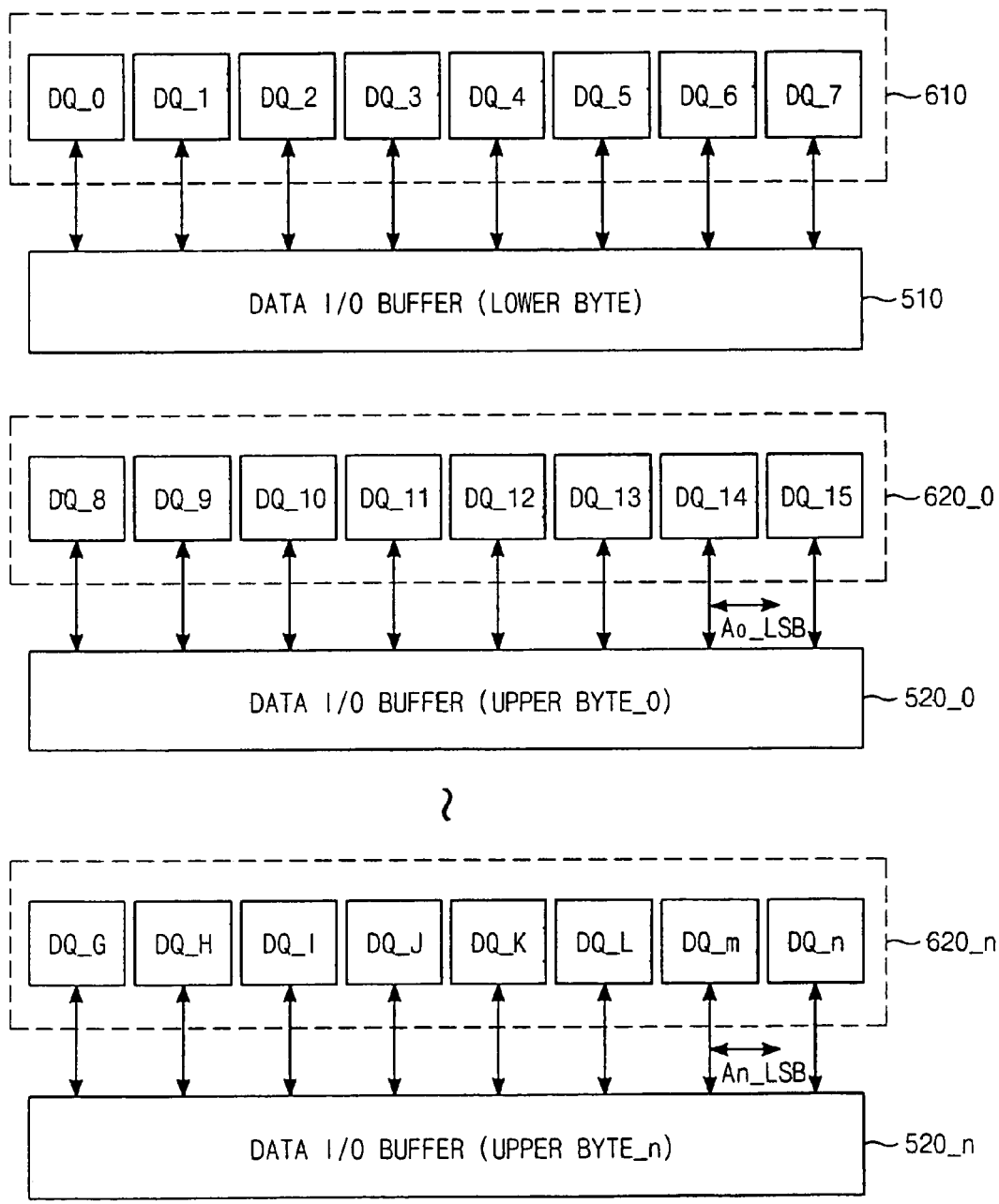

FIG. 8d has the same structure of FIG. 8c. However, it is different in that the control signals $A_0\_LSB$ through $A_n\_LSB$ are provided from one of the bits included in each upper byte region except the most significant bits.

Figure 9A:
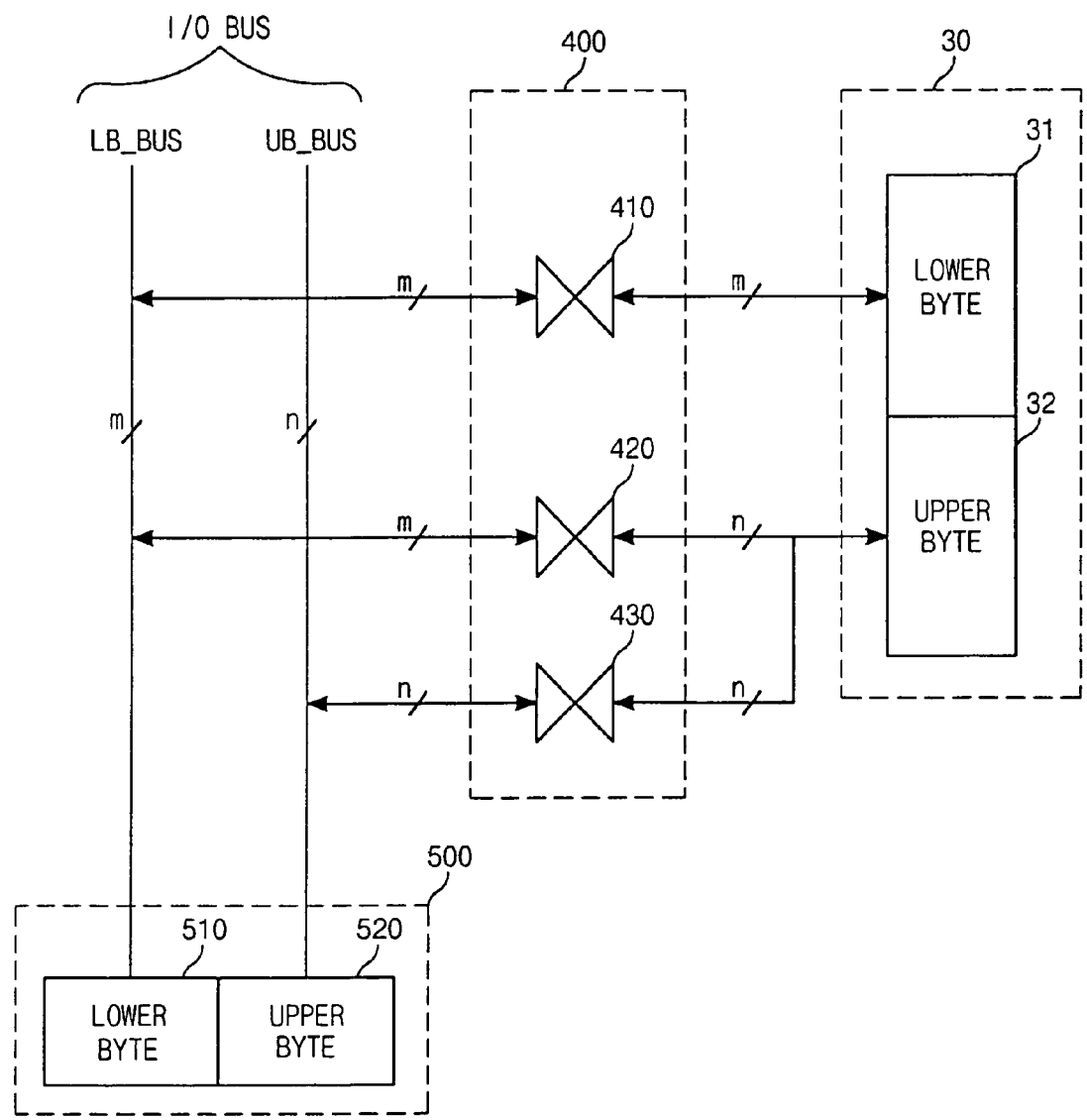
FIGS. 9a through 9b are structural diagrams illustrating a switch array, a data I/O buffer and a sense amplifier array of FIG. 1.
Figure 9B:
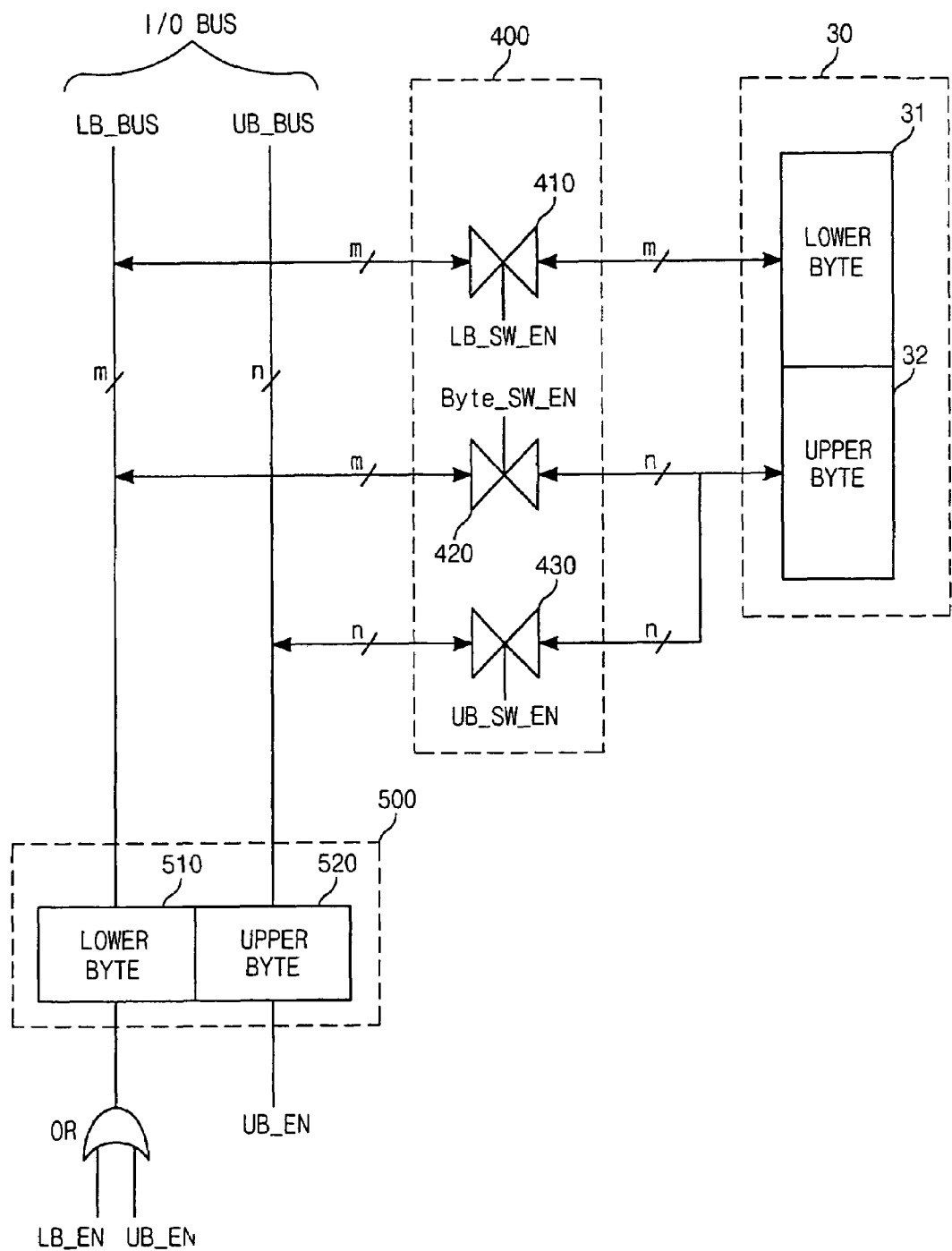

FIGS. 9a through 9b are structural diagrams illustrating the switch array 400, the data I/O buffer 500 and the sense amplifier array 30 of FIG. 1.

The data I/O buffer 500 is connected to an I/O bus. The I/O bus is divided into a lower byte bus LB_BUS and an upper byte bus UB_BUS. The lower byte bus LB_BUS comprises m bits, and the upper byte bus LB_BUS comprises n bits. The lower byte bus LB_BUS is connected to the lower byte region 510 of the data I/O buffer 500. The upper byte bus UB_BUS is connected to the upper byte region 520 of the data I/O buffer. Each sense amplifier included in the sense amplifier array 30 is divided into a lower byte region 31 and an upper byte region 32.

The switch array 400 comprises a first switch 410, a second switch 420 and a third switch 430. The first switch 410 connects the lower byte bus LB_BUS to the lower byte region 31 of the sense amplifier array 30. The second switch 420 connects the lower byte bus LB_BUS to the upper byte region 32 of the sense amplifier array 30. The third switch 430 connects the upper byte bus UB_BUS to the upper byte region 32 of the sense amplifier array 30. The second switch 420 transmits n bits of sense amplifier bits to the lower byte bus LB_BUS.

FIG. 9b additionally shows control signals in the switch array 400 and the data I/O buffer 500 of FIG. 9a. The lower byte region 510 of the data I/O buffer 500 is controlled by ORing the control signals LB_EN and Byte_EN. The on/off operations of the first switch 410 are controlled by a control signal LB_SW_EN. The on/off operations of the second switch 420 are controlled by a control signal Byte_SW_EN. The on/off operations of the third switch 430 are controlled by a control signal UB_SW_EN.

Figure 10:
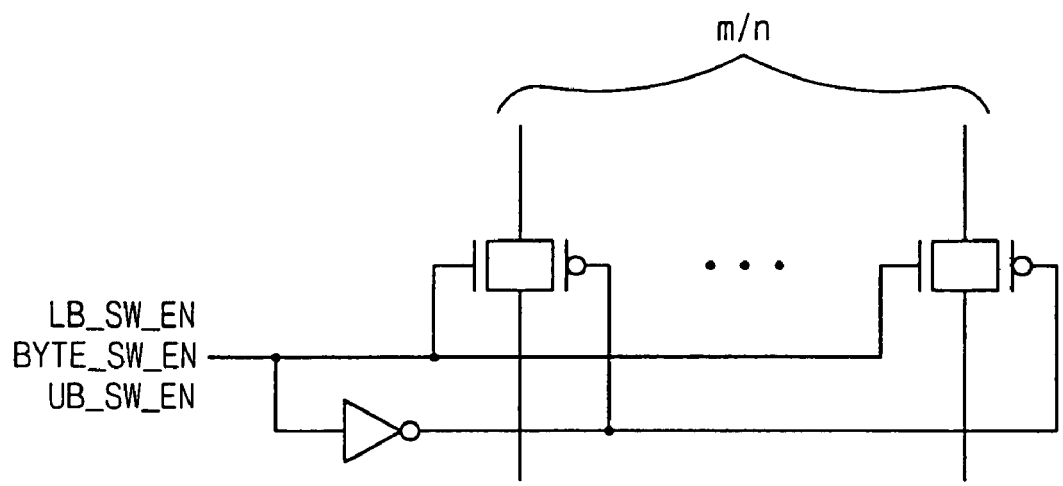
FIG. 10 is a structural diagram illustrating the switch array of FIG. 9.

FIG. 10 is a structural diagram illustrating the switch array 400 of FIG. 9. According to a preferred embodiment of the present invention, the first switch 410, the second switch 420 and the third switch 430 have the same structure. Each switch comprises a predetermined number of transmission gates arranged in parallel. A transmission gate included in the first switch 410 is controlled by the control signal LB_SW_EN. A transmission gate included in the second switch 420 is controlled by the control signal Byte_SW_EN. A transmission gate included in the third switch 430 is controlled by the control signal UB_SW_EN.

Figure 11:
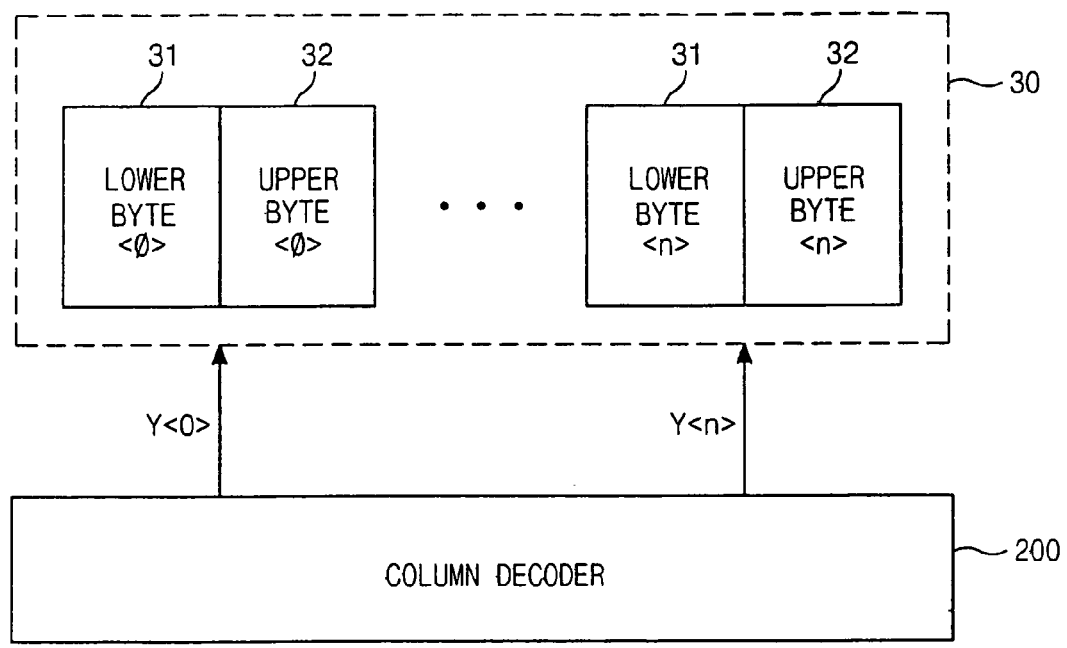
FIG. 11 is a structural diagram illustrating the sense amplifier array and a column decoder of FIG. 1.

FIG. 11 is a structural diagram illustrating the sense amplifier array 30 and a column decoder 200 of FIG. 1. As described above, each sense amplifier in the sense amplifier array 30 is included either in the lower byte region 31 or in the upper byte region 32. The sense amplifier array is controlled by output signals Y<0>~Y<n> of the column decoder 200.

Figure 12A:
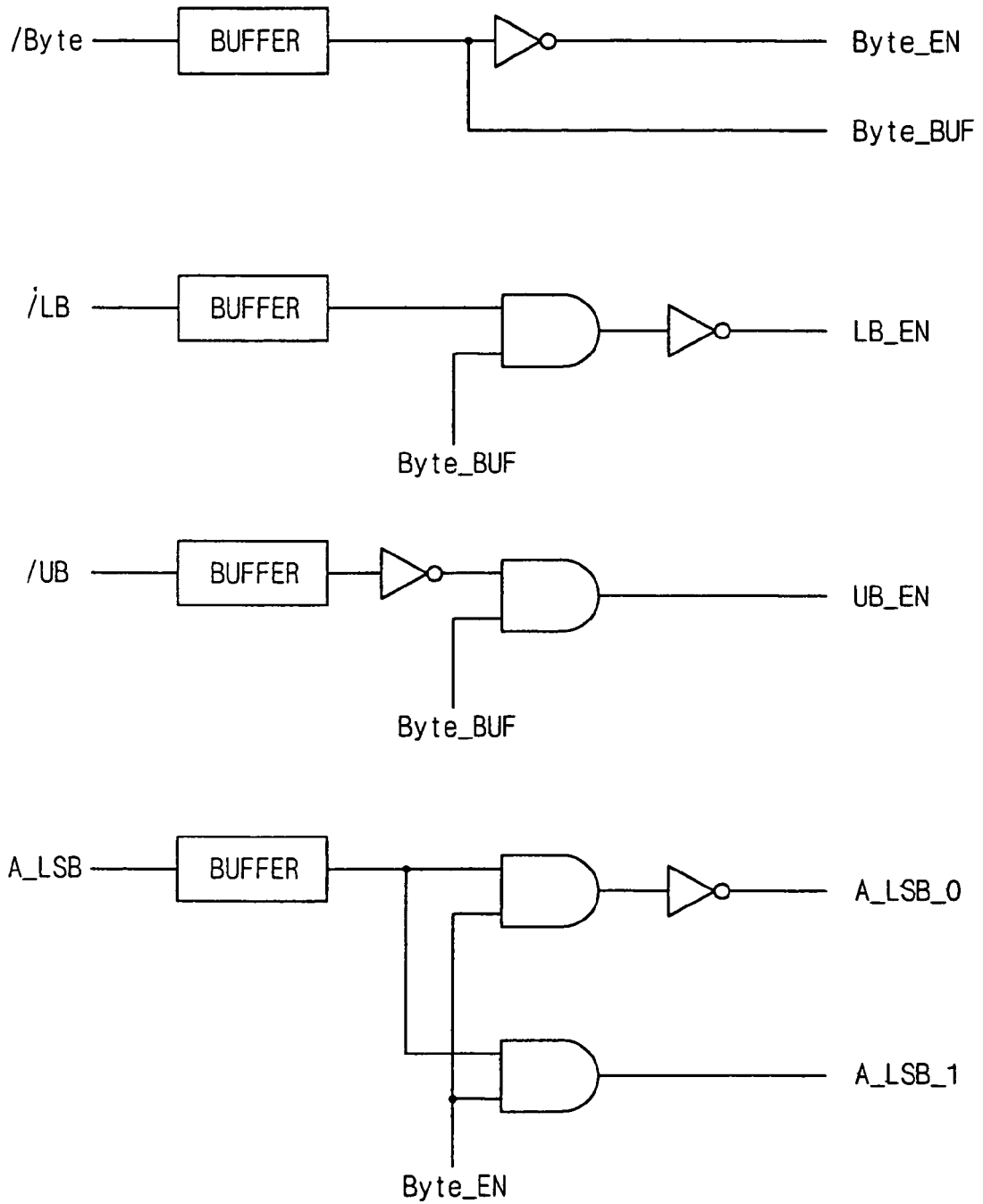
FIGS. 12a through 12b are detailed structural diagrams of a switch controller of FIG. 1.
Figure 12B:
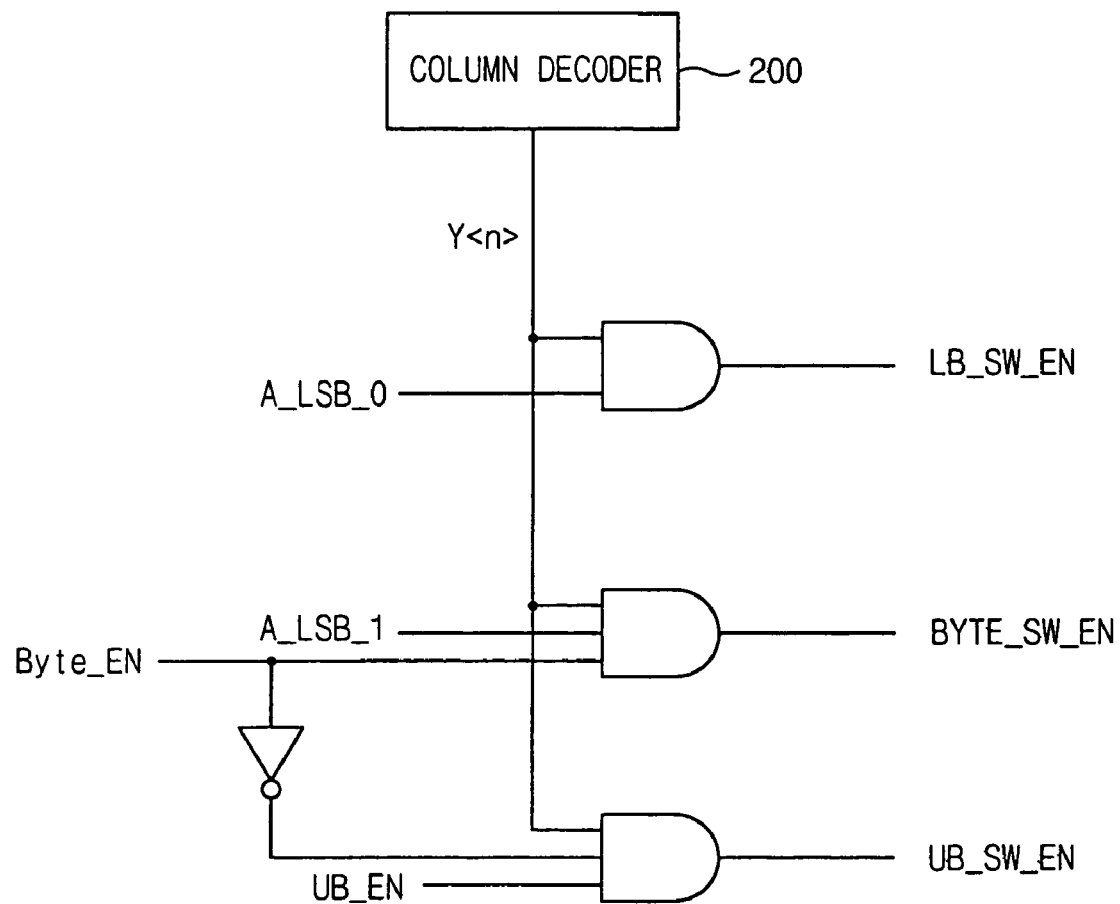

FIGS. 12a through 12b are detailed structural diagrams of the switch controller 300 of FIG. 1. The switch controller 300 receives control signals A_LSB, /Byte, /LB, /UB, and output signals of the column decoder to provide control signals LB_SW_EN, UB_SW_EN, Byte_SW_EN, LB_EN and UB_EN.

Referring to FIG. 12a, the circuit of FIG. 12a generates control signals LB_EN and UB_EN provided to the data I/O buffer 500 and control signals Byte_EN, Byte_BUF, A_LSB_0 and A_LSB_1 used in the intermediate process.

The /Byte signal determines activation of the lower byte region. The Byte_BUF signal is generated by buffering the /Byte signal, and the Byte_EN signal is generated by inverting the Byte_BUF signal.

The /LB signal determines activation of lower bytes. The LB_EN signal is generated by performing an AND operation on ("ANDing") the buffered /LB signal and the Byte_BUF signal and then by inverting the signal obtained from the AND operation. When the /Byte signal is "low", the Byte_BUF signal is "low". As a result, the LB_EN signal becomes "high" regardless of the level of the /LB signal. However, when the /Byte signal is "high", the Byte_BUF signal is "high". As a result, the level of the LB_EN signal is regulated by that of the /LB signal.

The /UB signal regulates activation of upper bytes. The UB_EN signal is generated by ANDing the Byte_BUF signal and a signal generated by buffering and then inverting the /UB signal. When the /Byte signal is "low", the Byte_BUF signal is "low". As a result, the UB_EN signal becomes "low" regardless of the level of the /LB signal. However, when the /Byte signal is "high", the Byte_BUF signal is "high". As a result, the level of the UB_EN signal is regulated by that of the /UB signal.

The A_LSB signal converts data of upper bytes into data of lower bytes. The A_LSB_1 signal is generated by ANDing the A_LSB signal and the Byte_EN signal. The A_LSB_0 signal is generated by ANDing the A_LSB signal and the Byte_EN signal and then inverting the signal obtained by the AND operation. When the /Byte signal is "low", the Byte_EN signal is "high", one of the A_LSB_1 or the A_LSB_0 signals becomes "high", and the other signal becomes "low". However, when the /Byte signal is "high", the Byte_EN signal is "low". As a result, the level of the A_LSB_0 signal becomes "high", and the level of the A_LSB_1 signal becomes "low" regardless of the level of the A_LSB signal.

The circuit of FIG. 12b outputs control signals LB_SW_EN, UB_SW_EN and Byte_SW_EN by using the signals A_LSB_0, A_LSB_1, UB_EN and Byte_EN of FIG. 12a and the output Y<n> of the column decoder 200.

The control signal LB_SW_EN for controlling the on/off operation of the first switch 410 0f FIG. 9b is obtained by ANDing the A_LSB_0 signal and the output Y<n> of the column decoder 200. The control signal Byte_SW_EN for controlling the on/off operations of the second switch 420 of FIG. 9b is obtained by ANDing the signals A_LSB_1 and Byte_EN and the output Y<n> of the column decoder 200. The control signal UB_SW_EN for controlling the on/off operations of the third switch 430 of FIG. 9b is obtained by ANDing the inverted Byte_EN signal, the UB_EN signal and the output Y<n> of the column decoder 200. The function of each signal is as follows.

FIGS. 13a through 13d are timing diagrams illustrating operations of the switch array 400, the sense amplifier array 30 and the data I/O buffer 500.

Figure 13A:
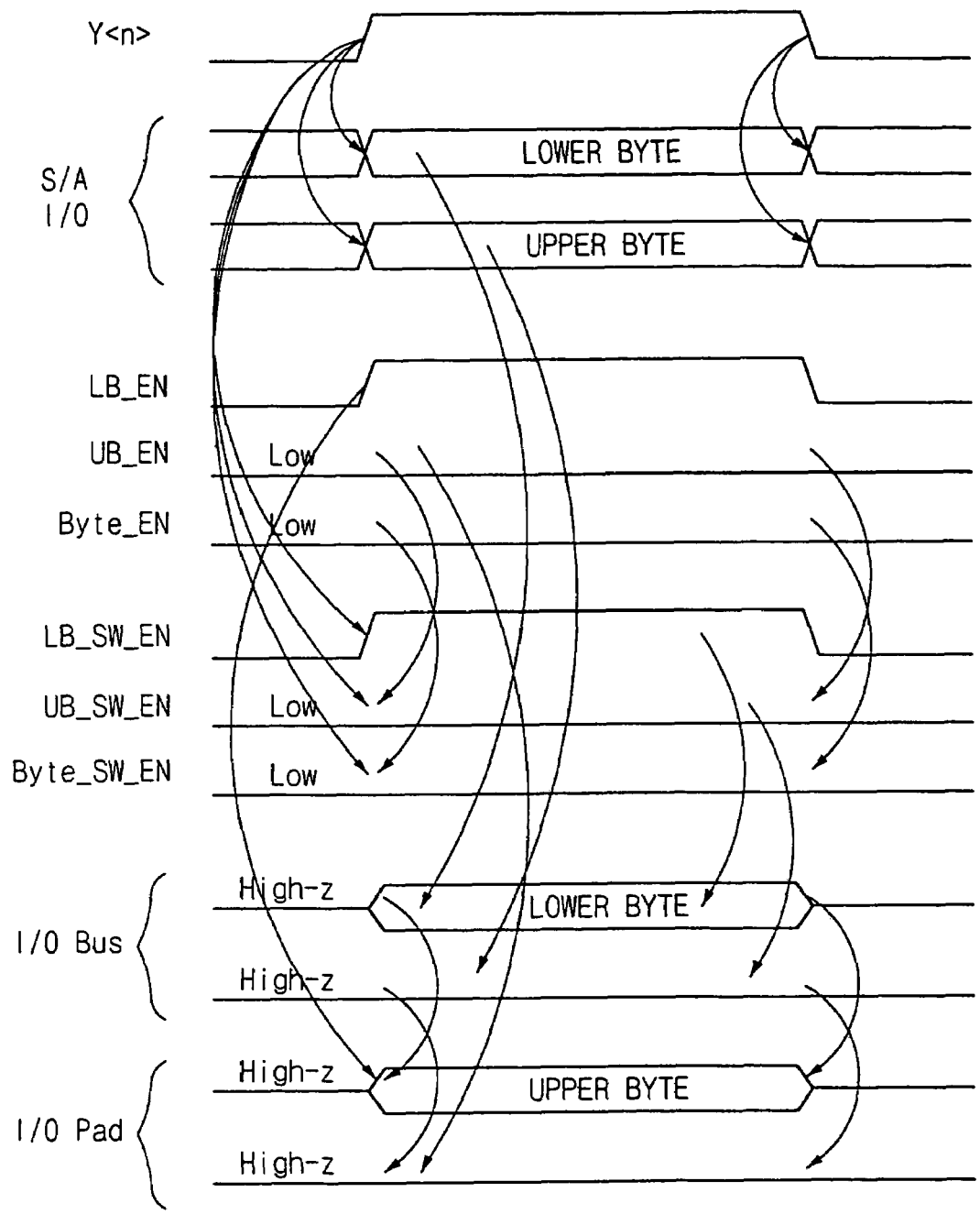
FIGS. 13a through 13d are timing diagrams illustrating operations of the switch array, the sense amplifier array and the data I/O buffer of FIG. 1.

FIG. 13a shows the timing diagram when the first switch 410 is activated, and data in the lower byte region 31 of the sense amplifier array 30 is provided to the lower byte region 510 of the data I/O buffer 500. In this state, the /Byte signal is inactivated to the "high" level, the /LB signal is activated to the "low" level, and the /UB signal is inactivated to the "high" level. Here, the Byte_EN signal becomes "low", the Byte_BUF signal becomes "high", the LB_EN signal becomes "high", the UB_EN signal becomes "low", and the A_LSB_0 becomes "high", and the A_LSB_1 becomes "low" (see FIG. 12a).

Since the A_LSB_0 signal is "high", the LB_SW_EN signal becomes "high". Since the UB_EN signal is "low", the UB_SW_EN becomes "low" (see FIG. 12b). As a result, the upper byte region 520 of the data I/O buffer 500 is inactivated (see FIG. 9b). If the LB_EN signal becomes "high", a signal obtained by performing an OR operation on ("ORing") the signals LB_EN and Byte_EN becomes "high". As a result, the lower byte region 510 of the data I/O buffer 500 is activated (see FIG. 9b). Here, data in the lower byte region 31 of the sense amplifier array 30 is outputted into the lower byte region 510 of the data I/O buffer 500.

Figure 13B:
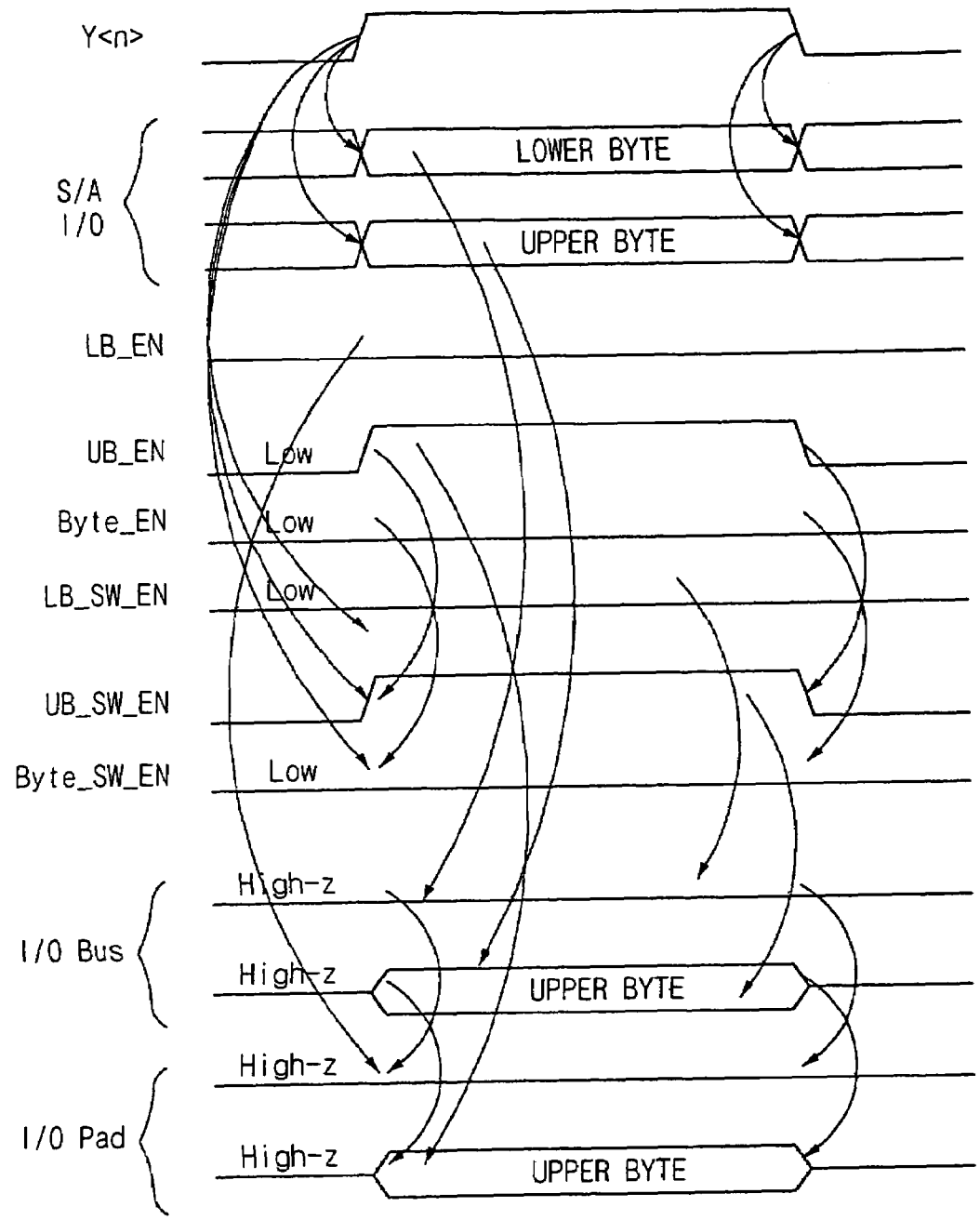

FIG. 13b shows the timing diagram when the third switch 430 is activated, and data in the lower byte region 32 of the sense amplifier array 30 is provided to the lower byte region 520 of the data I/O buffer 500. In this state, the /Byte signal is inactivated to the "high" level, the /LB signal is inactivated to the "high" level, and the /UB signal is activated to the "low" level. Here, the Byte_EN signal becomes "low", the Byte_BUF signal becomes "high", the LB_EN signal becomes "low", the UB_EN signal becomes "high", and the A_LSB_0 becomes "high", and the A_LSB_1 becomes "low" (see FIG. 12a).

Since the A_LSB_0 signal is "high", the LB_SW_EN signal becomes "high". Since the UB_EN signal is "high", the UB_SW_EN becomes "high" (see FIG. 12b). As a result, the upper byte region 520 of the data I/O buffer 500 is activated (see FIG. 9b). If the LB_EN signal becomes "low", a signal obtained by ORing the signals LB_EN and Byte_EN becomes "low". As a result, the lower byte region 510 of the data I/O buffer 500 is inactivated (see FIG. 9b). Here, data in the upper byte region 32 of the sense amplifier array 30 is outputted into the upper byte region 520 of the data I/O buffer 500.

Figure 13C:
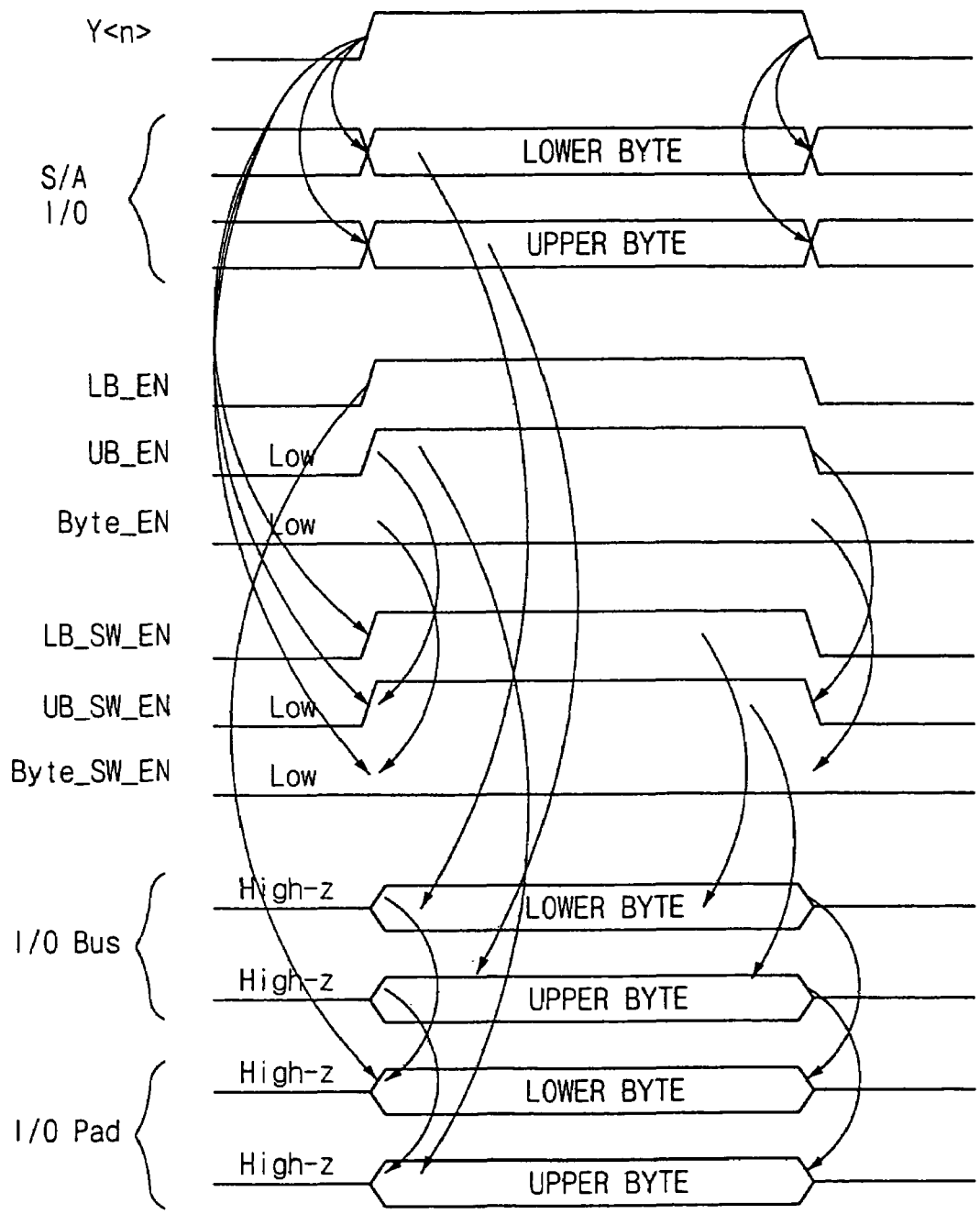

FIG. 13c shows the timing diagram when the first switch 410 and the third switch 430 are activated, data in the lower byte region 31 of the sense amplifier array 30 is provided to the lower byte region 510 of the data I/O buffer 500, and data in the upper byte region 32 of the sense amplifier array 30 is outputted into the upper byte region 520 of the data I/O buffer 500. The detailed operation is omitted because it is similar to the above-described operation.

Figure 13D:
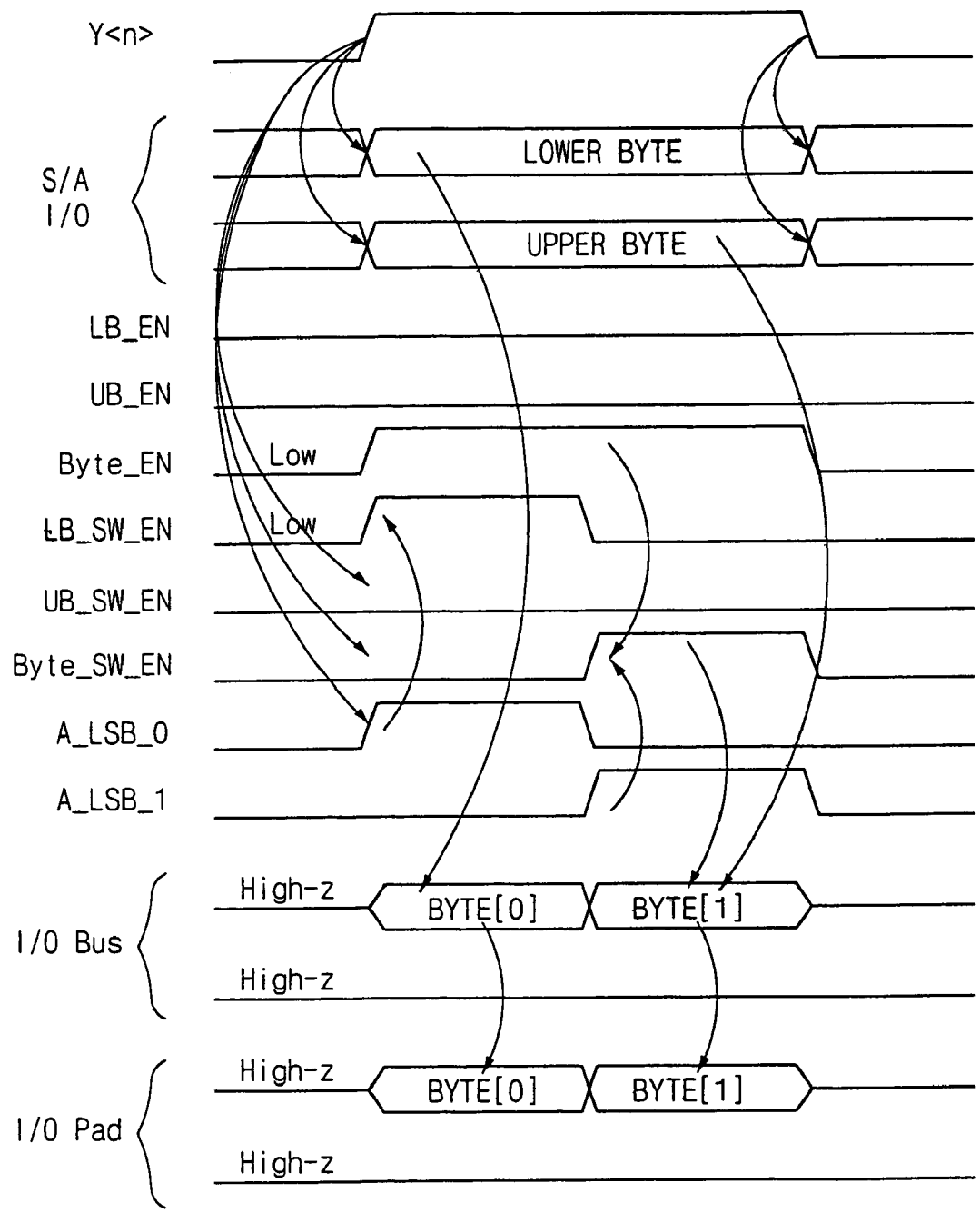

FIG. 13d shows the timing diagram when the first switch 410 and the second switch 420 are activated in turn. In this state, the /Byte signal is inactivated to the "low" level, and the /LB signal and the /UB signal are inactivated to the "high" level. Here, the Byte_EN signal becomes "high", the Byte_BUF signal becomes "low", the LB_EN signal becomes "high", the UB_EN signal becomes "low", and the A_LSB_0 becomes a signal obtained by inverting the A_LSB signal, and the A_LSB_1 becomes the same value of the A_LSB signal (see FIG. 12a).

Since the output Y<n> of the column decoder 200 is activated, the Byte_EN signal is "high", the UB_SW_EN signal is "low", the LB_SW_EN is at the same level with the A_LSB_0, and the Byte_SW_EN is at the same level with the A_LSB_1. If the A_LSB signal is "high", the LB_SW_EN becomes "low", and the Byte_SW_EN becomes "high". If the A_LSB signal is "low", the LB_SW_EN signal becomes "high", and the Byte_SW_EN signal becomes "low" (see FIG. 12b). As a result, the upper byte region 520 of the data I/O buffer 500 is inactivated, and the lower byte region 510 is activated (see FIG. 9b).

An example is described where data of a memory device is processed by 2 bytes, and data of a system bus is processed by 1 byte. Here, an address of a system bus is designated every 1 byte of data, and an address of a memory device is designated every 2 bytes of data. The number of address bits used in the system should be one more than that used in the memory device. The data bit A_LSB in the upper byte region is used as an address bit in order to compensate for the insufficient address bit (see FIGS. 8a through 8d).

The process of storing data into a memory is as follows. An address of a system bus is designated every 1 byte of data, and the system bus is provided to the lower byte region 510 of the data I/O buffer 500. Here, if the A_LSB_0 signal becomes "high", the A_LSB_ becomes "high", the LB_SW_EN becomes "low", and the Byte_SW_EN becomes "high". As a result, the lower byte region 510 of the data I/O buffer 500 becomes connected to the lower byte region 31 of the sense amplifier array 30 via the first switch 410 (see FIGS. 9b, 12a and 12b). If the A_LSB signal becomes "low", the A_LSB_0 signal becomes "high", the LB_SW_EN becomes "high", and the Byte_SW_EN signal becomes "low". As a result, the lower byte region 510 of the data I/O buffer 500 becomes connected to the upper byte region 32 of the sense amplifier array 30 via the second switch 420.

The process of reading data from the sense amplifier array 30 to the data I/O buffer 500 is performed as described above.

Accordingly, the semiconductor memory device of the present invention does not need extra interfacing devices by effectively changing the data I/O bandwidth of the memory device.

While the present invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A memory device, comprising:
 a plurality of data I/O buffers connected one by one to a plurality of I/O ports for inputting/outputting a plurality of data bits;
 a switch array comprising a plurality of switches for delivering data between a data bus and the plurality of data I/O buffers to process the data by an adjustable number of data bits; and
 a switch controller for controlling activation of the plurality of data I/O data buffers and on/off operations of the plurality of switches in response to external control signals and outputs of a column decoder, wherein the switch controller receives one of the external control signals via one of the data I/O ports.

2. A memory device, comprising:
 buffer means for receiving and outputting a plurality of data bits in response to a buffer control signal, the buffer means coupled to a plurality of data I/O pin means for providing electrical connections to external circuits;
 sense means for sensing and amplifying a plurality of data bits delivered through a data bus, wherein the sense means is controlled by outputs of a column decoding means;
 switch means for connecting the buffer means to the sense means in response to a switch control signal; and
 control means for receiving external control signals and the outputs of the column deco ding means, wherein at least one of the external control signals and the outputs of the column decoding signals is received via one or more of the plurality of the data I/O pins, for controlling the buffer means by providing the buffer control signal, and for controlling the switch means by providing the switch control signal 3. The memory device according to claim 1, further comprising:
a sense amplifier array for detecting and amplifying the data delivered through the data bus to transfer the data into the switch array, wherein the sense amplifier is controlled by the outputs of the column decoder.

4. The memory device according to claim 1, further comprising:
a plurality of cell array blocks for storing the data; and
a plurality of column selection controllers for selectively delivering the data between the plurality of cell array blocks and the data bus.

5. The memory device according to claim 3, wherein the memory device is a ferroelectric memory device having a bitline structure comprising:
a main bitline;
a plurality of sub bitlines;
a main bitline load controller for controlling impedance between the main bitline and a power voltage source according to a first control signal;
a main bitline pull-up controller for providing a voltage to the main bitline according to a second control signal, wherein the main bitline pull-up controller is in an active state during a precharge operation; and
a current controller for controlling a current flowing from the main bitline to a ground according to a sensing voltage of one sub bitline of the plurality of the sub bitlines to induce a sensing voltage of the main bitline according to the current.

6. The memory device according to claim 2, wherein the memory device is a ferroelectric memory device having a bitline structure comprising:
a main bitline;
a plurality of sub bitlines;
a main bitline load controller for controlling impedance between the main bitline and a power voltage source according to a first control signal, wherein the main bitline load controller is in an active state during a sensing operation of the main bit line;
a main bitline pull-up controller for providing a voltage to the main bitline according to a second control signal, wherein the main bitline pull-up controller is in an active state during a precharge operation; and
a current controller for controlling a current flowing from the main bitline to a ground according to a sensing voltage of one sub bitline of the plurality of the sub bitlines to induce a sensing voltage of the main bitline according to the current.

* * * * *